United States Patent
Asano et al.

(10) Patent No.: US 6,771,069 B2
(45) Date of Patent: Aug. 3, 2004

(54) SYSTEMS AND METHODS FOR ACHIEVING A RECOVERY OF SPINS OF NUCLEI

(75) Inventors: Kenji Asano, Tokyo (JP); Susumu Kosugi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/191,948

(22) Filed: Jul. 9, 2002

(65) Prior Publication Data

US 2003/0011367 A1 Jan. 16, 2003

(30) Foreign Application Priority Data

Jul. 10, 2001 (JP) .................................. 2001-208916

(51) Int. Cl.[7] .................................................. G01V 3/00
(52) U.S. Cl. ...................................................... 324/309
(58) Field of Search ................................ 324/300, 307, 324/309; 600/410

(56) References Cited

U.S. PATENT DOCUMENTS

| | | | |
|---|---|---|---|
| 4,620,154 A | * 10/1986 | Inouye | 324/309 |
| 4,684,892 A | * 8/1987 | Graumann | 324/309 |
| 4,694,250 A | * 9/1987 | Iwaoka et al. | 324/309 |
| 5,023,551 A | * 6/1991 | Kleinberg et al. | 324/303 |
| 5,113,865 A | * 5/1992 | Maeda et al. | 600/410 |
| 5,189,371 A | * 2/1993 | Conolly et al. | 324/309 |
| 5,248,942 A | * 9/1993 | Ratzel et al. | 324/309 |
| 5,281,917 A | * 1/1994 | Santyr | 324/309 |
| 5,404,882 A | * 4/1995 | Santyr | 600/410 |
| 5,508,612 A | 4/1996 | Kanazawa | |
| 5,543,709 A | 8/1996 | Kajiyama | |
| 5,629,624 A | * 5/1997 | Carlson et al. | 324/309 |
| 5,655,531 A | * 8/1997 | Nishimura et al. | 600/413 |
| 5,657,757 A | * 8/1997 | Hurd et al. | 600/413 |
| 5,677,626 A | 10/1997 | Miyazaki et al. | |
| 5,722,409 A | 3/1998 | Kuhara et al. | |
| 5,742,163 A | * 4/1998 | Liu et al. | 324/309 |
| 5,751,145 A | * 5/1998 | Shimizu | 324/309 |
| 5,853,365 A | 12/1998 | Yamagata | |
| 5,942,897 A | 8/1999 | Kanazawa | |
| 6,023,634 A | 2/2000 | Hanawa et al. | |
| 6,046,589 A | 4/2000 | Lamerichs et al. | |
| 6,094,049 A | 7/2000 | Rosenfeld et al. | |
| 6,144,201 A | 11/2000 | Miyazaki | |
| 6,169,398 B1 | 1/2001 | Watanabe et al. | |
| 6,294,913 B1 | 9/2001 | Hinks et al. | |
| 6,320,378 B1 | 11/2001 | Maier et al. | |
| 6,359,436 B1 | 3/2002 | Miyamoto et al. | |
| 6,388,442 B1 | 5/2002 | Uetake et al. | |
| 6,393,313 B1 | 5/2002 | Foo | |
| 6,424,152 B1 | 7/2002 | Prins et al. | |

* cited by examiner

*Primary Examiner*—Christopher W. Fulton
*Assistant Examiner*—Dixomara Vargas
(74) *Attorney, Agent, or Firm*—Carl B. Horton, Esq.; Armstrong Teasdale LLP

(57) ABSTRACT

The present invention aims at making it possible to successfully achieve fast recovery during magnetic resonance imaging in which the fast spin echo technique combined with the inversion recovery technique is implemented. A 180° x pulse is applied in order to excite spins. Thereafter, when an inversion time TI has elapsed, a 90° x pulse is applied in order to excite the spins. Thereafter, when a half of a time esp has elapsed, a 180° y pulse is applied in order to excite the spins. Thereafter, when the time esp has elapsed, the 180° y pulse is applied an odd number of times in order to sequentially excite the spins. Thereafter, when a half of the time esp has elapsed, the 90° x pulse is applied in order to excite the spins.

20 Claims, 8 Drawing Sheets

SYSTEMS AND METHODS FOR ACHIEVING A RECOVERY OF SPINS OF NUCLEI

CROSS REFERENCE TO RELATED APPLICATIONS

This application claims the benefit of Japanese Application No. 2001-208916 filed Jul. 10, 2001.

BACKGROUND OF THE INVENTION

The present invention relates to a spin exciting method, a magnetic resonance imaging method, and a magnetic resonance imaging system. More particularly, the present invention relates to a spin exciting method, a magnetic resonance imaging method, and a magnetic resonance imaging system for performing magnetic resonance imaging according to a fast spin echo (FSE) technique combined with an inversion recovery (IR) technique.

In a magnetic resonance imaging (MRI) system, a subject of imaging is carried into a bore of a magnet system, that is, an imaging space in which a static magnetic field is created. Magnetic field gradients and a radio-frequency magnetic field are applied to the subject in order to excite spins in the subject. Consequently, a magnetic resonance signal is induced, and an image is reconstructed based on the signal received.

A sequence of exciting spins so as to induce a magnetic resonance signal and receiving the signal is repeated at predetermined intervals of a repetition time TR. The TR is often set to a time long enough for the excited spins to recover to exhibit an original longitudinal magnetization. When an imaging time must be shortened, the TR is set to a short time and spins are forcibly recovered. The forcible recovery of spins is achieved with additional excitation. This technique is referred to as fast recovery.

Japanese Examined Patent Publication No. 4-21488 describes that the fast recovery is combined with the IR. In short, as shown in FIG. 7, spins are turned 180° with application of a 180° pulse and thus brought to an inversion. Thereafter, when a predetermined inversion time TI has elapsed, a 90° pulse is applied in order to turn the spins 90°. A free induction decay (FID) signal that is induced accordingly is then acquired.

Thereafter, when a half of an echo time TE has elapsed, a −180° pulse is applied in order to reverse the spins. Thereafter, when a half of the TE has elapsed, a −90° pulse is applied in order to turn the spins −90° and a 180° pulse is then applied in order to reverse the spins. Thus, the fast recovery of the spins is achieved.

U.S. Pat. No. 6,054,853 describes that the fast recovery is combined with the FSE. In short, as shown in FIG. 8, a 90° x pulse is applied in order to excite spins and turn them 90° with respect to an x axis. Thereafter, when a half of an echo space esp has elapsed, a 180° y pulse is applied in order to reverse the spins with respect to a y axis. Thereafter, when the esp has elapsed, the 180° y pulse is applied in order to reverse the spins again with respect to the y axis. When the echo space esp has elapsed, the 180° y pulse is applied in order to reverse the spins again with respect to the y axis. Consequently, a spin echo is acquired during the echo space esp between applications of the 180° y pulse.

When a half of the echo space esp has elapsed since the last application of the 180° y pulse, a −90° x pulse is applied in order to turn the spins −90°, and a 180° x pulse is applied in order to reverse the spins. Thus, the fast recovery of the spins is achieved.

According to the technology described in the Japanese Examined Patent Publication No. 4-21488, the fast recovery employing the −90° pulse and 180° pulse is achieved through unselective excitation that is not intended to select a slice. This disables multiple slice imaging that interleaves pulse sequences like the foregoing one and involves a plurality of slices.

According to the related art described in the U.S. Pat. No. 6054853, the fast recovery employing the −90° x pulse and 180° is performed through selective excitation. However, a selected slice is not perfectly square. It is not easy to properly achieve the fast recovery using the two selective excitation pulses.

Moreover, the number of reversals of spins stemming from application of the 180° y pulse is an odd value. If the degree of the reversal of spins stemming from application of the 180° y pulse has an error, the spins are not restored to exactly face along the x-y plane. Therefore, the succeeding fast recovery is achieved imperfectly.

SUMMARY OF THE INVENTION

Therefore, an object of the present invention is to realize a spin exciting method, a magnetic resonance imaging method, and a magnetic resonance imaging system for properly performing fast recovery during magnetic resonance imaging in which the fast spin echo technique combined with the inversion recovery technique is implemented.

(1) In one aspect of the present invention intended to solve the aforesaid problems, there is provided a spin exciting method for producing an image using a magnetic resonance signal induced by spins in a subject being imaged according to the fast spin echo technique combined with the inversion recovery. Specifically, a 180° pulse is applied in order to excite spins. Thereafter, when a first time has elapsed, a first 90° x pulse is applied in order to excite the spins. Thereafter, when a second time has elapsed, a 180° y pulse is applied in order to excite the spins. Thereafter, when a third time that is double the second time has elapsed, the 180° y pulse is applied an odd number of times in order to sequentially excite the spins. Thereafter, when the second time has elapsed, a second 90° x pulse is applied in order to excite the spins.

(2) In another aspect of the present invention intended to solve the aforesaid problems, there is provided a magnetic resonance imaging method for producing an image using a magnetic resonance signal induced by spins in a subject being imaged according to the fast spin echo technique combined with the inversion recovery technique. Specifically, a 180° pulse is applied in order to excite spins. Thereafter, when a first time has elapsed, a first 90° x pulse is applied in order to excite the spins. Thereafter, when a second time has elapsed, a 180° y pulse is applied in order to excite the spins. Thereafter, when a third time that is double the second time has elapsed, the 180° y pulse is applied an odd number of times in order to sequentially excite the spins. Thereafter, when the second time has elapsed, a second 90° x pulse is applied in order to excite the spins. A spin echo is read during the third time, and an image is produced based on the spin echo.

(3) In another aspect of the present invention intended to solve the aforesaid problems, there is provided a magnetic resonance imaging system for producing an image using a magnetic resonance signal induced by spins in a subject being imaged according to the fast spin echo technique combined with the inversion recovery technique. The magnetic resonance imaging system includes a spin exciting means, an echo reading means, and an image producing means. The spin exciting means excites spins with application of a 180° pulse. Thereafter, when a first time has elapsed, the spin exciting means applies a first 90° x pulse to excite the spins. Thereafter, when a second time has elapsed, the spin exciting means applies a 80° y pulse to excite the spins. Thereafter, when a third time that is double the second time has elapsed, the spin exciting means applies the 180° y pulse an odd number of times to excite the spins sequenlially. Thereafter, when the second time has elapsed, the spin exciting means applies a second 90° x pulse to excite the spins. The echo reading means reads a spin echo during the third time. The image producing means produces an image according to the spin echo.

In the aspects of the present invention set forth in paragraphs (1) to (3), a 180° pulse is applied in order to excite spins. Thereafter, when the first time has elapsed, a first 90° x pulse is applied in order to excite the spins. Thereafter, when the second time has elapsed, a 180° y pulse is applied in order to excite the spins. Thereafter, when the third time that is double the second time has elapsed, the 180° y pulse is applied an odd number of times in order to excite the spins. Thereafter, when the second time has elapsed, a second 90° x pulse is applied in order to excite the spins. The spins are reversed an even number of times due to the applications of the 180° y pulse, and therefore returned to exactly face along the xy plane. Consequently, the spins are accurately recovered with the subsequent application of the 90° x pulse.

Moreover, the inversion recovery is performed with application of the 90° x pulse alone. Therefore, imperfect fast recovery stemming from the employment of two selective excitation pulses as conventionally will not take place.

In order to successfully achieve fast recovery of spins whose relaxation time is relatively long, the second 90° x pulse should preferably be a +90° x pulse.

In order to achieve imaging while enhancing a magnetic resonance signal induced by spins whose relaxation time is relatively long, the first time should preferably be shorter than the polarity recovery time for spins that are used for imaging.

In order to successfully achieve fast recovery of spins whose relaxation time is relatively short, the second 90° x pulse should preferably be a −90° x pulse.

In order to achieve imaging while enhancing a magnetic resonance signal induced by spins whose relaxation time is relatively short, the first time should preferably be longer than the polarity recovery time for spins that are used for imaging.

In order to produce a tomographic image, excitation should preferably be selective excitation all the time.

In order to achieve multiple slice imaging, a series of excitations starting with excitation initiated with application of the 180° pulse and ending with excitation initiated with application of the second 90° x pulse should preferably be started at successive time instants within the first time with slices changed sequentially.

According to the present invention, there are provided a spin exciting method, a magnetic resonance imaging method, and a magnetic resonance imaging system for making it possible to properly achieve fast recovery during magnetic resonance imaging in which the fast spin echo technique combined with the inversion recovery technique is implemented.

Further objects and advantages of the present invention will be apparent from the following description of the preferred embodiments of the invention as illustrated in the accompanying drawings.

DETAILED DESCRIPTION OF THE INVENTION

Figure 1:
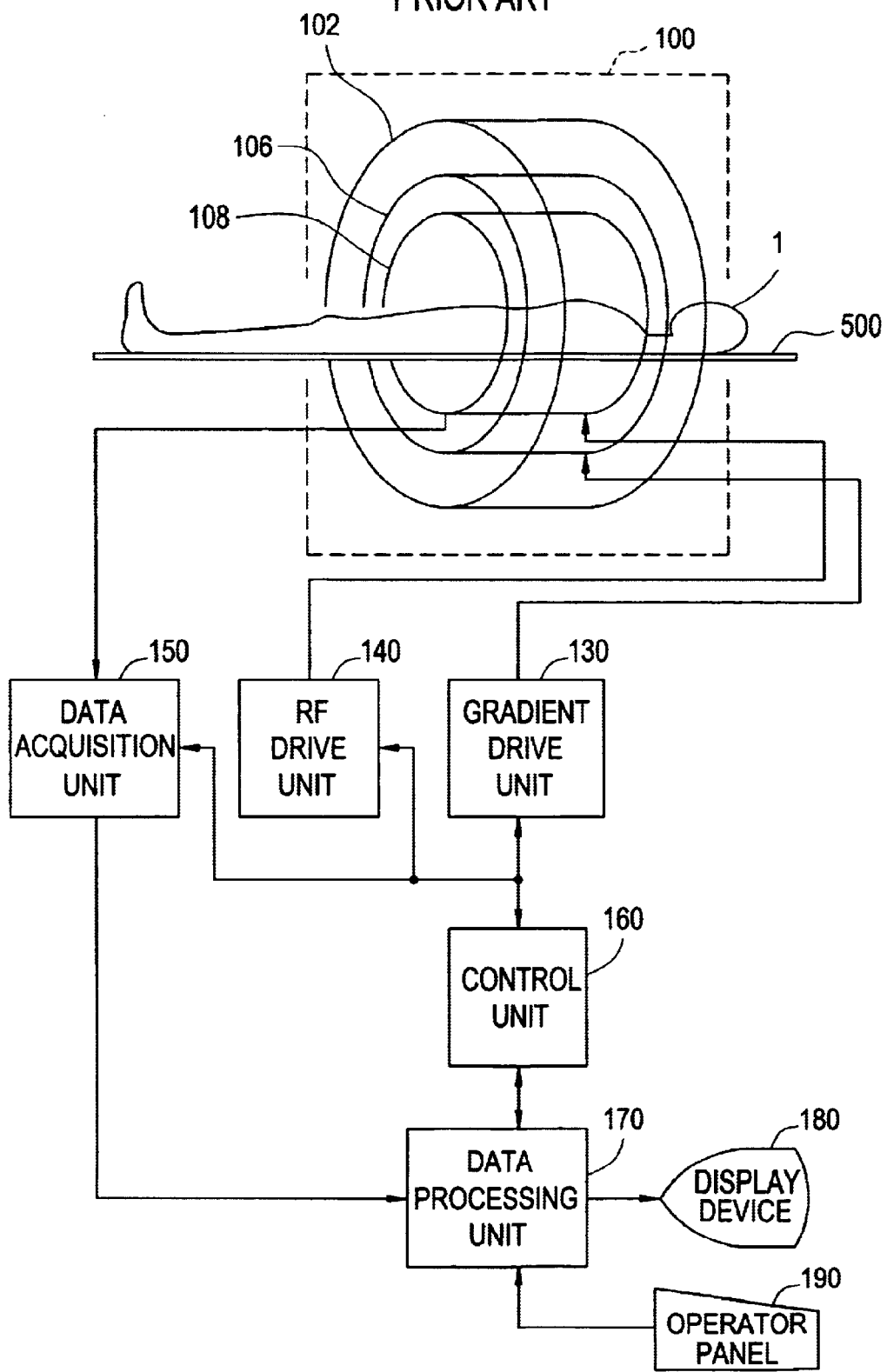
FIG. 1 is a block diagram showing an example of a magnetic resonance imaging system in accordance with an embodiment of the present invention.

Embodiments of the present invention will be described with reference to drawings below. FIG. 1 is a block diagram of a magnetic resonance imaging system. The system is an example of an embodiment of the present invention. The system configuration provides the example of the magnetic resonance imaging system in accordance with the embodiment of the present invention. The actions of the system provide an example of a magnetic resonance imaging method in accordance with an embodiment of the present invention.

As illustrated, the system includes a magnet system 100. The magnet system 100 includes a main magnetic field coil assembly 102, a gradient coil assembly 106, and a radio-frequency (RF) coil assembly 108. These coil assemblies are shaped substantially cylindrically and arranged mutually coaxially. A subject 1 of imaging is carried into or taken out of a substantially cylindrical bore of the magnet system 100 by means of a transporting means, which is not shown, while lying down on a cradle 500.

The main magnetic field coil assembly 102 creates a static magnetic field in the bore of the magnet system 100. The direction of the static magnetic field is substantially parallel to the body-axis direction of the subject 1. Namely, the main magnetic field coil assembly 102 creates a so-called horizontal magnetic field. The main magnetic field coil assembly 102 is realized with, for example, a superconductor. Alternatively, the main magnetic field coil assembly 102 may be realized with a normal conductor or the like.

The gradient coil assembly 106 generates three magnetic field gradients that are oriented in three mutually perpendicular axes, that is, a slice-selecting axis, a phase-encoding axis, and a frequency-encoding axis, and that give a gradient to the strength of the static magnetic field.

Assuming that the mutually perpendicular coordinate axes in the space of the static magnetic field are x, y, and z axes, any of the axes may be regarded as the slice-selecting axis. In this case, one of two remaining axes is regarded as the phase-encoding axis and the other axis is regarded as the frequency-encoding axis. Moreover, the slice-selecting axis, phase-encoding axis, and frequency-encoding axis may be inclined arbitrarily with respect to the x, y, and z axes while remaining mutually perpendicular. In the present system, the body-axis direction of the subject 1 shall be regarded as the z-axis direction.

A magnetic field gradient oriented in the direction of the slice-selecting axis may be referred to as a slice-selecting magnetic field gradient. A magnetic field gradient oriented in the direction of the phase-encoding axis may be referred to as a phase-encoding magnetic field gradient. A magnetic field gradient oriented in the direction of the frequency-encoding axis may be referred to as a readout magnetic field gradient. In order to generate these magnetic field gradients, the gradient coil assembly 106 includes three gradient coils that are not shown. Hereinafter, the magnetic field gradient may simply be termed a gradient.

The RF coil assembly 108 creates a radio-frequency magnetic field, which is used to excite spins in the body of the subject 1, in the space of the static magnetic field. Hereinafter, the creation of an RF magnetic field may be expressed as transmission of an RF excitation signal. Moreover, the RF excitation signal may be called an RF pulse. The RF coil assembly 108 receives electromagnetic waves induced by the excited spins, that is, a magnetic resonance signal.

The RF coil assembly 108 includes a transmitter coil and a receiver coil that are not shown. The transmitter coil and receiver coil may be realized with one coil or dedicated coils.

A gradient drive unit 130 is connected to the gradient coil assembly 106. The gradient drive unit 130 applies a driving signal to the gradient coil assembly 106 and thus causes the gradient coil assembly 106 to generate magnetic field gradients. The gradient drive unit 130 includes three drive circuits, which are not shown, in association with the three gradient coils incorporated in the gradient coil assembly 106.

An RF drive unit 140 is connected to the RF coil assembly 108. The RF drive unit 140 applies a driving signal to the RF coil assembly 108, whereby an RF pulse is transmitted in order to excite spins in the body of the subject 1.

A data acquisition unit 150 is connected to the RF coil assembly 108. The data acquisition unit 150 samples a signal received by the RF coil assembly 108, and acquires the signal in the form of digital data.

A control unit 160 is connected to the gradient drive unit 130, RF drive unit 140, and data acquisition unit 150 respectively. The control unit 160 controls the gradient drive unit 130, RF drive unit 140, and data acquisition unit 150 respectively so as to achieve imaging.

The RF coil assembly 108, RF drive unit 140, and control unit 160 constitute an example of a spin exciting means employed in the present invention. The gradient coil assembly 106, gradient drive unit 130, RF coil assembly 108, data acquisition unit 150, and control unit 160 constitute an example of an echo reading means employed in the present invention. The control unit 160 is an example of a control means employed in the present invention.

The control unit 160 is realized with, for example, a computer. The control unit 160 includes a memory that is not shown. Programs describing instructions to be given to the control unit 160 and various data items are stored in the memory. The abilities of the control unit 160 are realized when the computer runs the programs stored in the memory.

The output terminal of the data acquisition unit 150 is connected to a data processing unit 170. Data acquired by the data acquisition unit 150 is transferred to the data processing unit 170. The data processing unit 170 is realized with, for example, a computer. The data processing unit 170 includes a memory that is not shown. Programs describing instructions to be given to the data processing unit 170 and various data items are stored in the memory.

The data processing unit 170 is connected to the control unit 160. The data processing unit 170 ranks higher than the control unit 160 and dominates the control unit 160. The facilities of the present system are realized when the data processing unit 170 runs the programs stored in the memory. The programs include methods 171 for achieving a recovery of spins of nuclei.

The data processing unit 170 stores data, which is acquired by the data acquisition unit 150, in the memory. A data space is preserved in the memory. The data space provides a two-dimensional Fourier space. The Fourier space shall be called a k-space. The data processing unit 170 performs two-dimensional inverse Fourier transform on the data in the k-space, thus reconstructing an image of the subject 1. The data processing unit 170 is an example of an image producing means employed in the present invention.

A display device 180 and an operator panel 190 are connected to the data processing unit 170. The display device 180 is realized with a graphic display or the like. The operator panel 190 is realized with a keyboard having a pointing device.

A reconstructed image and various information items provided by the data processing unit 170 are displayed on the display device 180. A user maneuvers the operator panel 190, and various commands and information items entered at the operator panel 190 are transferred to the data processing unit 170. The user operates the present system interactively via the display device 180 and operator panel 190.

Figure 2:
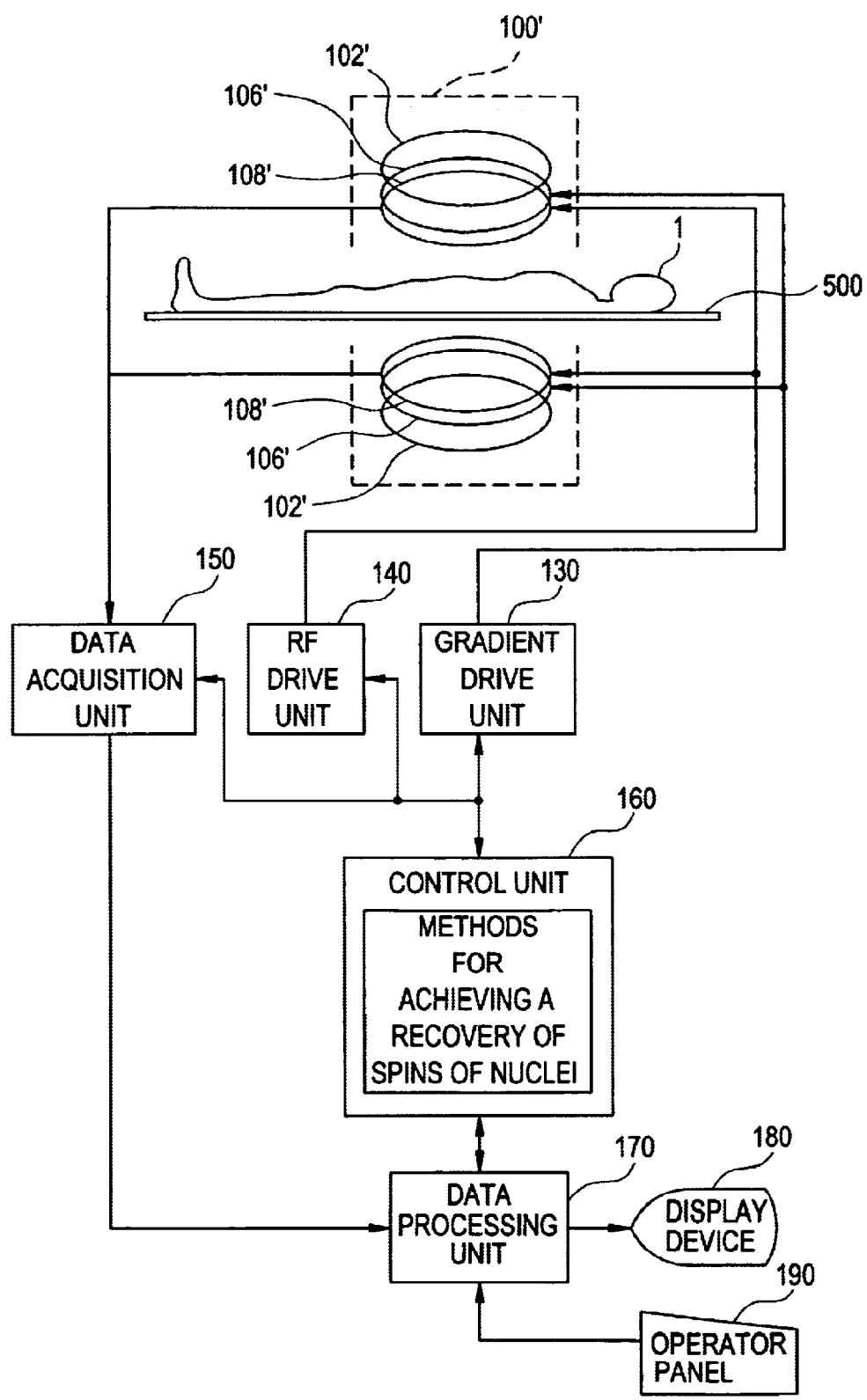
FIG. 2 is a block diagram showing an example of the magnetic resonance imaging system in accordance with the embodiment of the present invention.

FIG. 2 is a block diagram of another type of magnetic resonance imaging system. The magnetic resonance imaging system shown in FIG. 2 is an example of the embodiment of the present invention. The system configuration provides the example of the magnetic resonance imaging system in accordance with the embodiment of the present invention. The actions of the system provide an example of the magnetic resonance imaging method in accordance with the embodiment of the present invention.

The present system includes a magnet system 100' of a different type from the system shown in FIG. 1. The components other than the magnet system 100' are identical to those shown in FIG. 1. The same reference numerals are assigned to the identical components, and the description of the components is omitted.

The magnet system 100' includes a main field magnet assembly 102', a gradient coil assembly 106', and an RE coil assembly 108'. Each of the main field magnet assembly 102' and the coil assemblies include a pair of units opposed to each other with a space between them. Moreover, the units are each shaped substantially like a disk and share a center axis. A subject 1 lying down on a cradle 500 is carried into or taken out of the bore of the magnet system 100' by means of a transporting means that is not shown.

The main field magnet assembly 102' creates a static magnetic field in the bore of the magnet system 100'. The direction of the static magnet field is substantially orthogonal to the body-axis direction of the subject 1. The main field magnet assembly 102' creates a so-called vertical magnetic field. The main field magnet assembly 102' is realized with, for example, a permanent magnet. However, the main field magnet assembly 102' is not limited to the permanent magnet. Alternatively, the main field magnet assembly 102' may be realized with a superconducting magnet or a normal conducting magnet.

The gradient coil assembly 106' generates three magnetic field gradients that are oriented in three mutually perpendicular axes, that is, a slice-selecting axis, a phase-encoding axis, and a frequency-encoding axis, and each of which gives a gradient to the strength of the static magnetic field.

Assuming that the mutually perpendicular coordinate axes in the space of the static magnetic field are x, y, and z axes, any of the axes may be regarded as the slice-selecting axis. In this case, one of two remaining axes is regarded as the phase-encoding axis and the other axis is regarded as the frequency-encoding axis. Moreover, the slice-selecting axis, phase-encoding axis, and frequency-encoding axis may be inclined arbitrarily with respect to the x, y, and z axes while remaining perpendicular to one another. In the present system, the body-axis direction of the subject 1 shall be regarded as the z-axis direction.

A magnetic field gradient oriented in the direction of the slice-selecting axis may be referred to as a slice-selecting magnetic field gradient. A magnetic field gradient oriented in the direction of the phase-encoding axis may be referred to as a phase-encoding magnetic field gradient. A magnetic field gradient oriented in the direction of the frequency-encoding axis may be referred to as a readout magnetic field gradient. In order to generate these magnetic field gradients, the gradient coil assembly 106' includes three gradient coils that are not shown.

The RF coil assembly 108' transmits an RF pulse, which is used to excite spins in the subject 1, in the space of the static magnetic field. The RF coil assembly 108' receives a magnetic resonance signal induced by the excited spins.

The RF coil assembly 108' includes a transmitter coil and a receiver coil that are not shown. The transmitter coil and receiver coil may be realized with one coil or dedicated coils.

The RF coil assembly 108', RF drive unit 140, and control unit 160 constitute an example of the spin exciting means employed in the embodiment of the present invention. The gradient coil assembly 106', gradient drive unit 130, RF coil assembly 108', data acquisition unit 150, and control unit 160 constitute an example of the echo reading means employed in the embodiment of the present invention. The control unit 160 is an example of the control means employed in the embodiment of the present invention.

Figure 3:
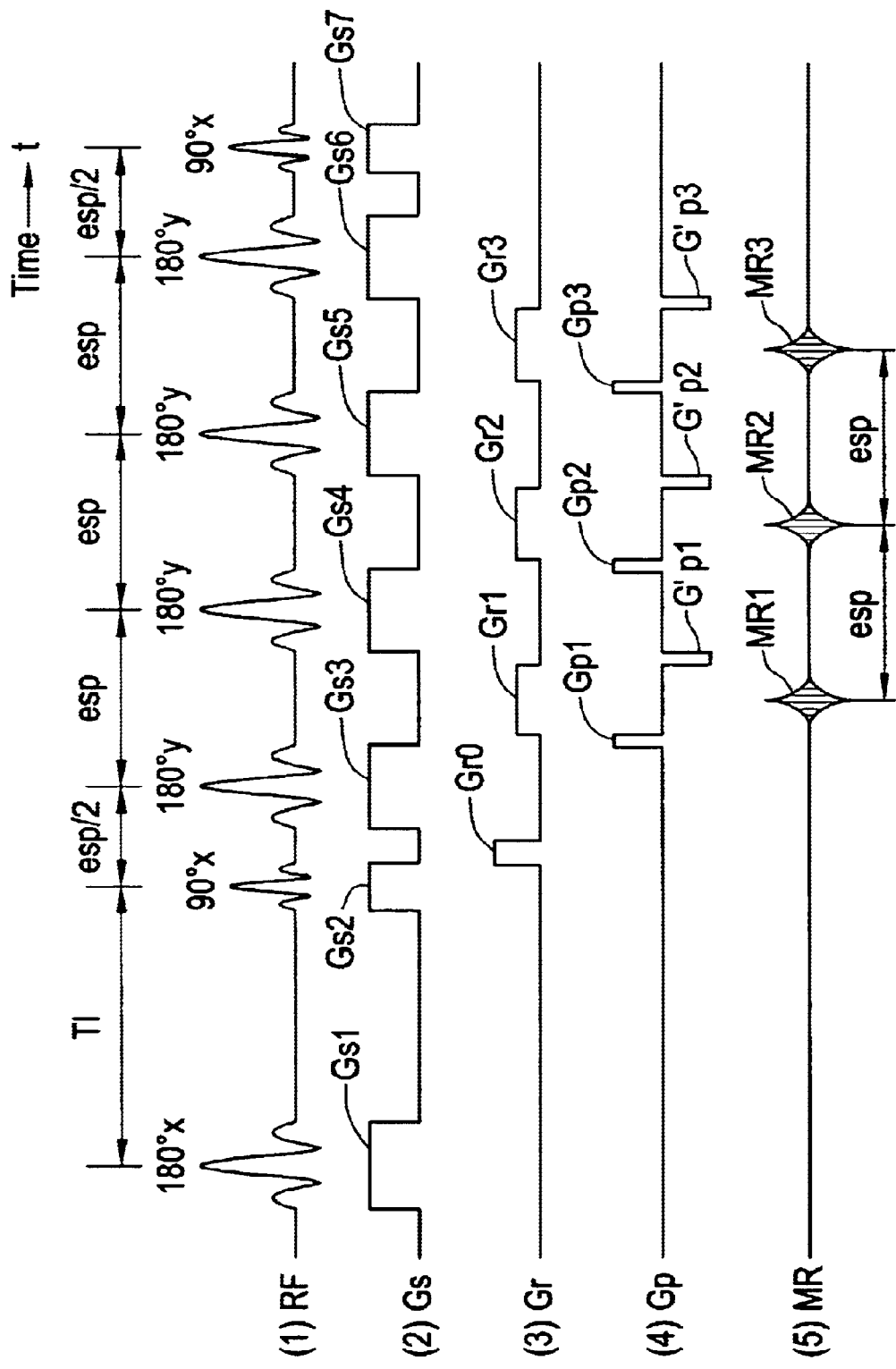
FIG. 3 shows an example of a pulse sequence to be employed in magnetic resonance imaging.

The actions of the present system will be described below. FIG. 3 schematically shows a pulse sequence to be adopted for the acquisition of a magnetic resonance signal performed in the system shown in FIG. 1 or FIG. 2. The pulse sequence is a pulse sequence devised for the fast spin echo technique combined with the inversion recovery technique.

Referring to FIG. 3, (1) shows RF pulses. (2), (3), (4), and (5) show slice-selecting magnetic field gradients Gs, readout magnetic field gradients Gr, phase-encoding magnetic field gradients Gp, and spin echoes MR respectively. The pulse sequence progresses from left to right along a time axis t.

As illustrated, first, a 180° x pulse is applied in order to reverse spins, that is, bring spins to an inversion. Hereinafter, the 180° x pulse may be referred to as an inversion pulse. Concurrently with the application of the inversion pulse, a slice-selecting magnetic field gradient Gs1 is applied in order to select a predetermined slice and bring spins in the slice to the inversion.

When the spins are brought to the inversion, a longitudinal magnetization exhibited by the spins is oriented opposite to the direction of the static magnetic field. Hereinafter, the longitudinal magnetization oriented opposite to the direction of the static magnetic field may be referred to as a negative longitudinal magnetization. The negative longitudinal magnetization changes to recover to the original correctly-oriented longitudinal magnetization with the passage of time. Hereinafter, the correctly-oriented longitudinal magnetization may be referred to as a positive longitudinal magnetization. In the course of recovering from the negative longitudinal magnetization to the positive longitudinal magnetization, the longitudinal magnetization changes its value from a negative value through zero to a positive value. In this specification, the time from the instant spins are brought to the inversion to the instant the value of the magnetization exhibited by the spins crosses zero shall be referred to as a polarity recovery time for spins.

When a predetermined time TI has elapsed since the spins are reversed, a 90° x pulse is applied in order to excite the spins so as to turn them 90° with respect to the x axis. The predetermined time TI is an inversion time. When the spins are excited to turn 90° with respect to the x axis, a slice-selecting magnetic field gradient Gs2 is applied. The same slice is selected for excitation. Consequently, the longitudinal magnetization being recovered is turned 90° with respect to the x axis. This results in a transverse magnetization, that is, a magnetization at right angles to the xy plane.

When a half of a predetermined time esp has elapsed since the spins are excited to turn 90° with respect to the x axis, a 180° y pulse is applied in order to reverse the spins. At this time, a slice-selecting magnetic field gradient Gs3 is applied in order to select the spins in the same slice for reversal.

After the spins are reversed, the 180° y pulse is applied a plurality of times at intervals of the predetermined time esp in order to reverse the spins. When the spins are reversed, a slice-selecting magnetic field gradient Gs4, Gs5, or Gs6 is applied for selective reversal. At each time, the same slice is selected in order to reverse the spins therein.

The number of times by which the reversals of spins is performed at intervals of the time esp is an odd value. Herein, the number of times is 3. However, the number of times is not limited to 3. Including the reversal initiated with application of the 180° y pulse after the 90° x pulse is applied for excitation, the reversal of the spins is performed an even number of times. Herein, the even number of times is 4. Needless to say, the even number of times is not limited to 4.

When a half of the predetermined time esp has elapsed since the last reversal of the spins, the 90° x pulse is applied in order to excite the spins and turn the spins 90° with respect to the x axis. At this time, a slice-selecting magnetic field gradient Gs7 is applied in order to select the same slice for selective excitation. The excitation with application of the 90° x pulse results in fast recovery of the spins. The reason why the fast recovery is achieved will be described later.

Between the first excitation initiated with application of the 90° x pulse and the excitation with application of the 180° y pulse, a readout magnetic field gradient Gr0 is applied in order to dephase spins lying along the frequency-encoding axis. Between the excitations initiated with applications of the 180° y pulse, readout magnetic field gradients Gr1, Gr2, and Gr3 are applied in order to rephase the spins and then dephase them. Consequently, spin echoes MR1, MR2, and MR3 are read out. Between the last excitation with application of the 180° y pulse and the last excitation with application of the 90° x pulse, a readout magnetic field gradient Gr4 is applied in order to rephase the spins.

Before and after the application of the readout magnetic field gradient Gr1, Gr2, or Gr3, phase-encoding magnetic field gradients Gp1 and Gp1', Gp2 and Gp2', or Gp3 and Gp3' are applied in order to start and stop phase encoding. The pair of magnetic field gradients causing phase encoding to start or end has strengths that assume the same absolute value and opposite signs. The absolute value is different between different pairs.

Each spin echo MRi (where i denotes 1,2,3, etc.) is an RF signal having a symmetrical waveform with respect to the middle of the echo. The time interval between the middles of spin echoes is the predetermined time esp or echo space. The spin echoes MRi are acquired as view data by the data acquisition unit 150.

The foregoing pulse sequence is repeatedly applied a predetermined number of times at intervals of a repetition time TR. Every time the pulse sequence is repeated, the phase-encoding magnetic field gradients have the direction thereof changed. This results in view data items of 64 to 256 views that represent the distributions of spins in different directions. The thus acquired view data is recorded in the k-space in the memory of the data acquisition unit 150.

The data in the k-space is subjected to two-dimensional inverse Fourier transform, whereby two-dimensional image data in an actual space, that is, a reconstructed image is produced. The image is displayed on the display device 180.

Figure 4:
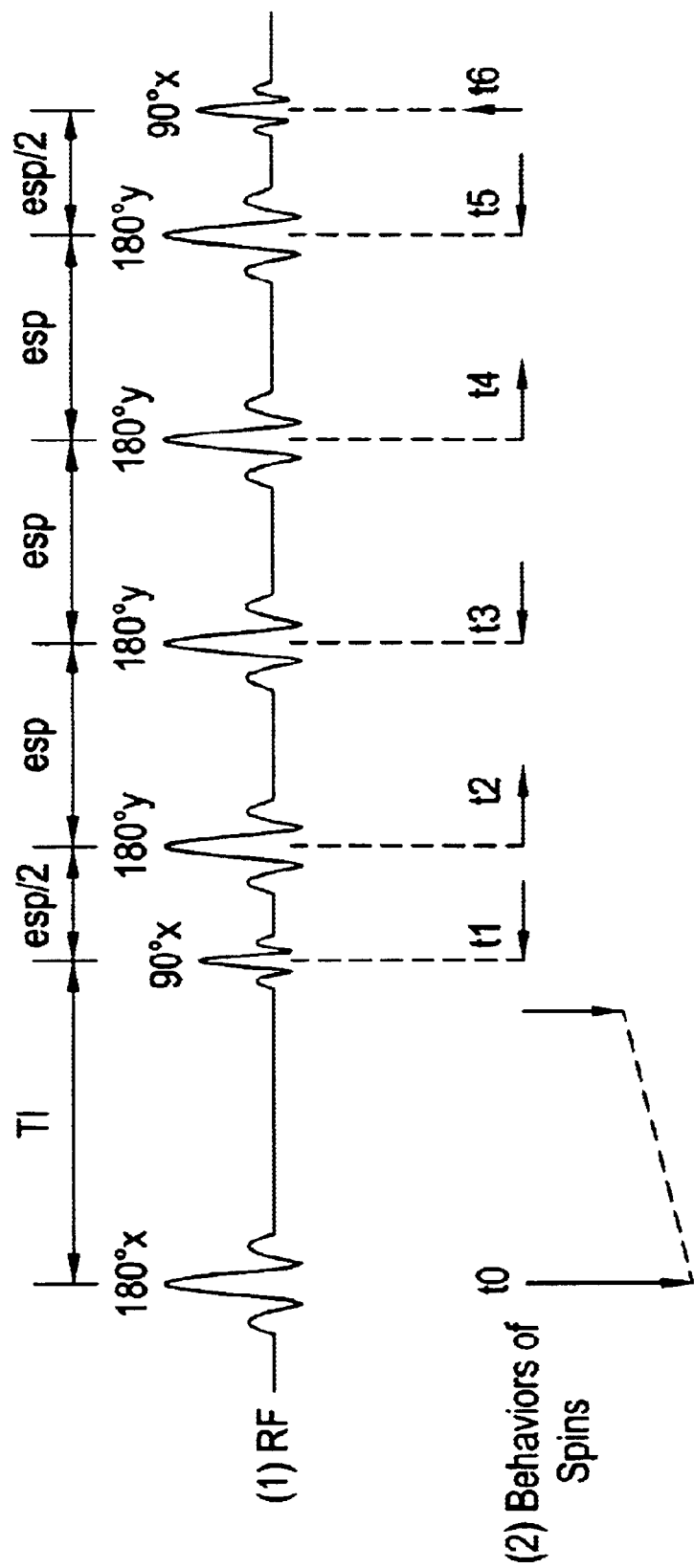
FIG. 4 is a conceptual diagram showing the behaviors of spins to be excited with applications of RF pulses.

The fast recovery of spins to be achieved using the aforesaid pulse sequence will be described below. FIG. 4 conceptually shows the behaviors of spins excited with applications of an RF pulse. Referring to FIG. 4, (1) shows RF pulses, and (2) shows the behaviors of spins in a rotating frame of reference using arrows.

As illustrated, the excitation with application of an inversion pulse at time instant t0 causes spins to exhibit a negative longitudinal magnetization. The spins exhibiting the negative longitudinal magnetization recover to exhibit a positive longitudinal magnetization with the passage of time.

Assuming that the polarity recovery time for spins is longer than the inversion time TI, when the TI has elapsed since the application of the inversion time, the spins being recovered still exhibit the negative longitudinal magnetization. When the spins are excited with application of a 90° x pulse at time instant t1, the spins are turned 90° with respect to the x axis. Assuming that the 90° turn of the spins stemming from the excitation with application of the +90° x pulse is expressed as a 90° clockwise rotation, the spins are oriented leftward as shown in FIG. 4. Consequently, the spins exhibit a magnetization at right angles to the xy plane, that is, a transverse magnetization.

Immediately after the spins are excited with application of the 90° x pulse, the spins are aligned with the y axis. The spins are a set of numerous spins. With application of a readout magnetic field gradient Gr0 succeeding the excitation with application of the 90° x pulse, the rotating speeds of the spins become different from one another. Consequently, spins having high rotating speeds lead the other spins, while the other spins having low rotating speeds lag behind. This results in a phase difference between spins. The phase differences increase with the passage of a gradient application time. This phenomenon is referred to as dephasing.

The phase difference manifests a difference in an orientation on the xy plane between spins. Now, the orientation of the spin having the highest rotating speed is indicated with an arrow of a solid line, and the orientation of the spin having the lowest rotating speed is indicated with an arrow of a dashed line. Moreover, the direction in which a spin leads another in terms of the phase shall be a clockwise direction, and the direction in which a spin lags behind in terms thereof shall be a counterclockwise direction.

Assume that immediately before time instant t2 when the first 180° y pulse is applied, fast spins and slow spins have phase differences like the one shown FIG. 4 between them. With application of the 180° y pulse at time instant t2, all the spins change their orientations 180° with respect to the y axis. Consequently, the positions of the fast spins and the positions of the slow spins are switched on the xy plane. Eventually, the fast spins and slow spins have relationships like the one shown in FIG. 4.

When a readout magnetic field gradient Gr1 is applied, even after the positions of the fast and slow spins are switched, the fast spins continuously make a phase change in the clockwise direction, and the slow spins continuously make a phase change in the counterclockwise direction. The phase difference between spins decreases. This phenomenon is referred to as rephasing.

The decreasing phase differences become nil at time instant t3, that is, are so-called refocused. When the phase differences are refocused, the orientation of the spins is identical to that of the spins attained when the spins are excited with application of the 90° x pulse at time instant t1.

After the refocused state passes, the phase differences between fast spins and slow spins start increasing (dephasing). Immediately before time instant t4 when the second 180° y pulse is applied, the phase differences between fast spins and slow spins become as shown in FIG. 4. With application of the 180° y pulse at time instant t4, the positions of the fast spins and the positions of the slow spins are switched on the xy plane.

Thereafter, the spins also behave as mentioned above. Immediately before time instant t5, the phase differences are refocused with application of a readout magnetic field gradient Gr4. Consequently, the orientation of the spins become identical to the orientation thereof attained at time instant t1 when the spins are excited with application of the 90° x pulse.

At time instant t6, the spins are excited with application of the 90° x pulse. Consequently, the spins change the orientation thereof 90° clockwise, and exhibit a positive longitudinal magnetization. Thus, the fast recovery of the spins is achieved.

In order to excite spins for recovery, the 90° x pulse alone is employed. Therefore, imperfect fast recovery will not take place, though it conventionally takes place when the combination of a −90° x pulse and 180° x pulse is used for excitation required for fast recovery. Moreover, since the 180° x pulse is unnecessary, the time required for recovery can be shortened.

Furthermore, when spins are reversed with application of the 180° y pulse, the spins are restored at every even-numbered time of excitation thereof. Even if the reversal of the spins made each time is imperfect because of the imperfect 180° y pulse, the spins are returned to the state attained before the reversal because of the even number of times of reversal. The spins that have not been reversed exhibit a transverse magnetization at right angles to the xy plane. When the spins are reversed an even number of times while being excited with application of the 180° y pulse, the spins are restored to exactly exhibit the transverse magnetization at right angles to the xy plane.

Now, the phase of each RF pulse will be described. The first 90° x pulse will be indicated with a subscript 90, each 180° y pulse will be indicated with a subscript 180, and the last 90° x pulse will be indicated with a subscript FR. Deviations Δf of the center frequencies of the pulses observed in a slice separated by a distance sloc from the center of the static magnetic field, that is, a magnet center are expressed as follows:

$$\Delta f_{90} = \gamma \times g_{90} \times sloc \quad (1)$$

$$\Delta f_{180} = \gamma \times g_{180} \times sloc \quad (2)$$

$$\Delta f_{FR} = \gamma \times g_{FR} \times sloc \quad (3)$$

where g denotes a gradient given by a slice-selecting magnetic field gradient, and γ denotes a gyromagnetic ratio.

Consequently, the phase difference ΔP between the first 90° x pulse and the 180° y pulse, and the phase difference ΔP between the 180° y pulse and the last 90° x pulse are expressed as follows:

$$\Delta P_{90\text{-}180} = 2\pi(\Delta f_{90} \times t_{90} - \Delta f_{180} \times t_{180}) \quad (4)$$

$$\Delta P_{180\text{-}FR} = 2\pi(\Delta f_{180} \times t_{180} - \Delta f_{FR} \times t_{FR}) \quad (5)$$

where t denotes a time from the instant application of each RF pulse is started to the instant the RF pulse assumes a peak.

Therefore, the phases P of the RF pulses are expressed as follows:

$$P_{90} = -\Delta_{90\text{-}180} \quad (6)$$

$$P_{180} = \pi/2 \quad (7)$$

$$P_{FR} = \Delta_{180\text{-}FR} \quad (8)$$

The foregoing fast recovery is suitable for visualization of spins for which the polarity recovery time is longer than the inversion time TI, that is, spins whose longitudinal relaxation time T1 is relatively long. The spins are, for example, spins in water.

In order to visualize spins in water, the inversion time TI is set to the same value as the polarity recovery time for spins in fat. Thus, an image rendering water alone but not rendering fat can be produced.

Figure 5:
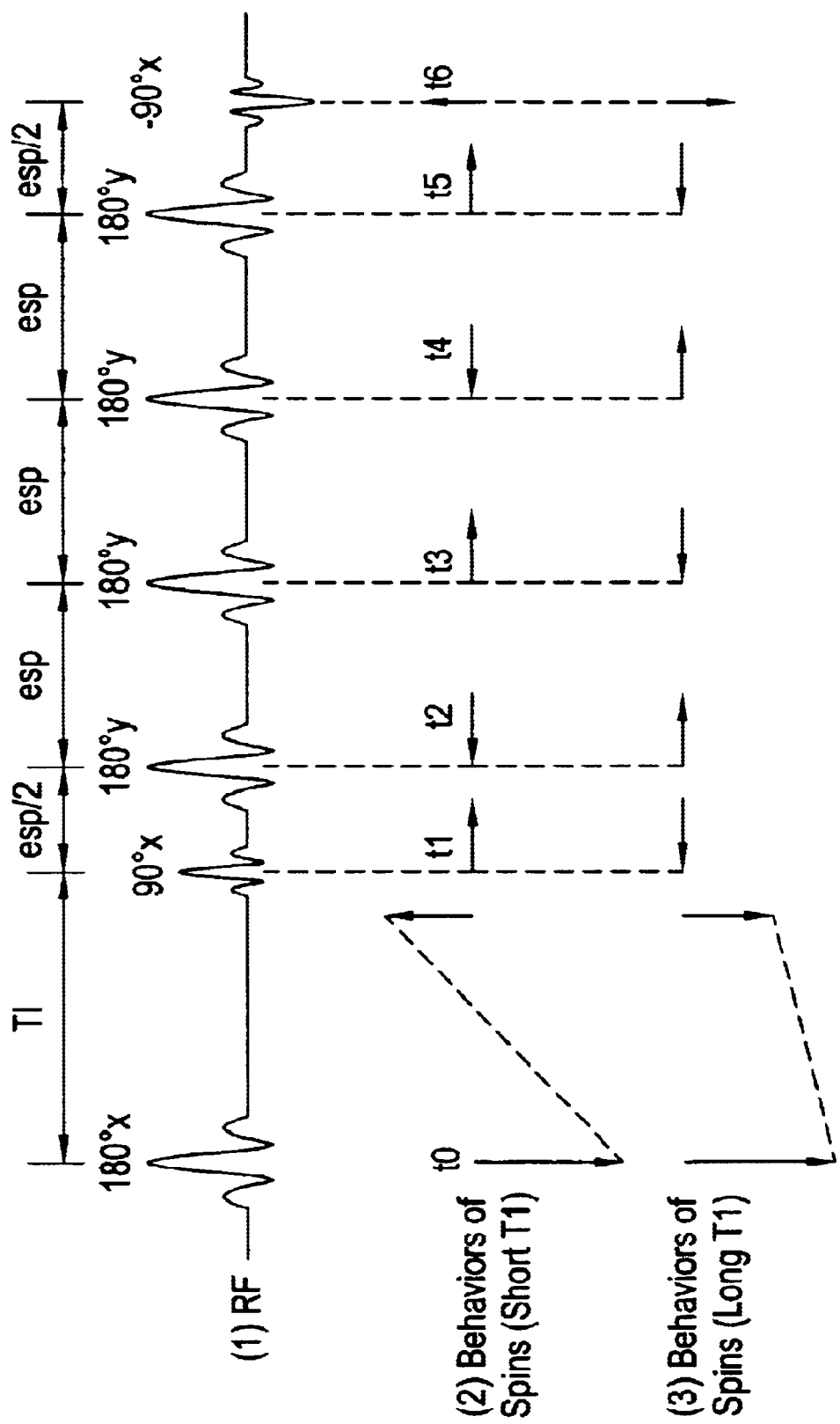
FIG. 5 is a conceptual diagram showing the behaviors of spins to be excited with applications of RF pulses.

FIG. 5 shows a pulse sequence devised for fast recovery to be performed in order to visualize spins for which the polarity recovery time is shorter than the inversion time TI thereof, that is, spins whose longitudinal relaxation time T1 is relatively short.

Referring to FIG. 5, (1) shows RF pulses. (2) and (3) show the behaviors of spins in a rotating frame of reference. (2) shows the behavior of spins whose longitudinal relaxation time T1 is relatively short. (3) shows the behavior of spins whose longitudinal relaxation time T1 is relatively long. This pulse sequence is different from the pulse sequence shown in FIG. 4 in a point that the last 90° x pulse to be applied for excitation is a −90° x pulse.

Spins whose longitudinal relaxation time T1 is relatively short exhibit, as shown in (2), a positive longitudinal magnetization after the elapse of the inversion time TI. When excited with application of the 90° x pulse at time instant t1, the spins are turned 90° with respect to the x axis and oriented rightward. Consequently, the spins exhibit a transverse magnetization at right angles to the xy plane. A 180° y pulse is applied to the spins at time instants t2, t4, t6, and t8. With every application of the 180° y pulse, the spins change the orientation thereof by 180° with respect to the y axis. At time instant t9, the spins are excited with application of the −90° x pulse. Consequently, the spins change the orientation thereof 90° counterclockwise, and exhibit a positive longitudinal magnetization. Thus, fast recovery is achieved.

In contrast, after the elapse of the inversion time TI, spins whose longitudinal relaxation time T1 is relatively long still exhibit, as shown in FIG. (3), a negative longitudinal magnetization. When excited with application of the 90° x pulse at time instant t1, the spins are turned 90° with respect to the axis and oriented leftward. Consequently, the spins exhibit a transverse magnetization at right angles to the xy plane. The 180° y pulse is applied to the spins at time instants t2, t2, t4, and t5. With every application of the 180° y pulse, the spins change the orientation thereof by 180° with respect to the y axis. The spins are excited with application of the −90° pulse at time instant t6, whereby the spins change the orientation thereof by 90° counterclockwise and exhibit a negative longitudinal magnetization.

A magnetic resonance signal induced by the spins exhibiting a negative longitudinal magnetization is suppressed. Namely, the magnetic resonance signal induced by the spins whose longitudinal relaxation time T1 is long can be suppressed by adopting the aforesaid pulse sequence. The pulse sequence is suitable for the fluid attenuated inversion recovery (FLAIR) technique in which a signal induced by a fluid is suppressed in order to produce an image rendering a parenchyma with a higher contrast.

In the aforesaid case, the phases P of RF pulses are expressed as follows:

$$P_{90} = -\Delta P_{90\text{-}180} \quad (9)$$

$$P_{180} = \pi/2 \quad (10)$$

$$P_{FR} = \pi + \Delta P_{180\text{-}FR} \quad (11)$$

Figure 6:
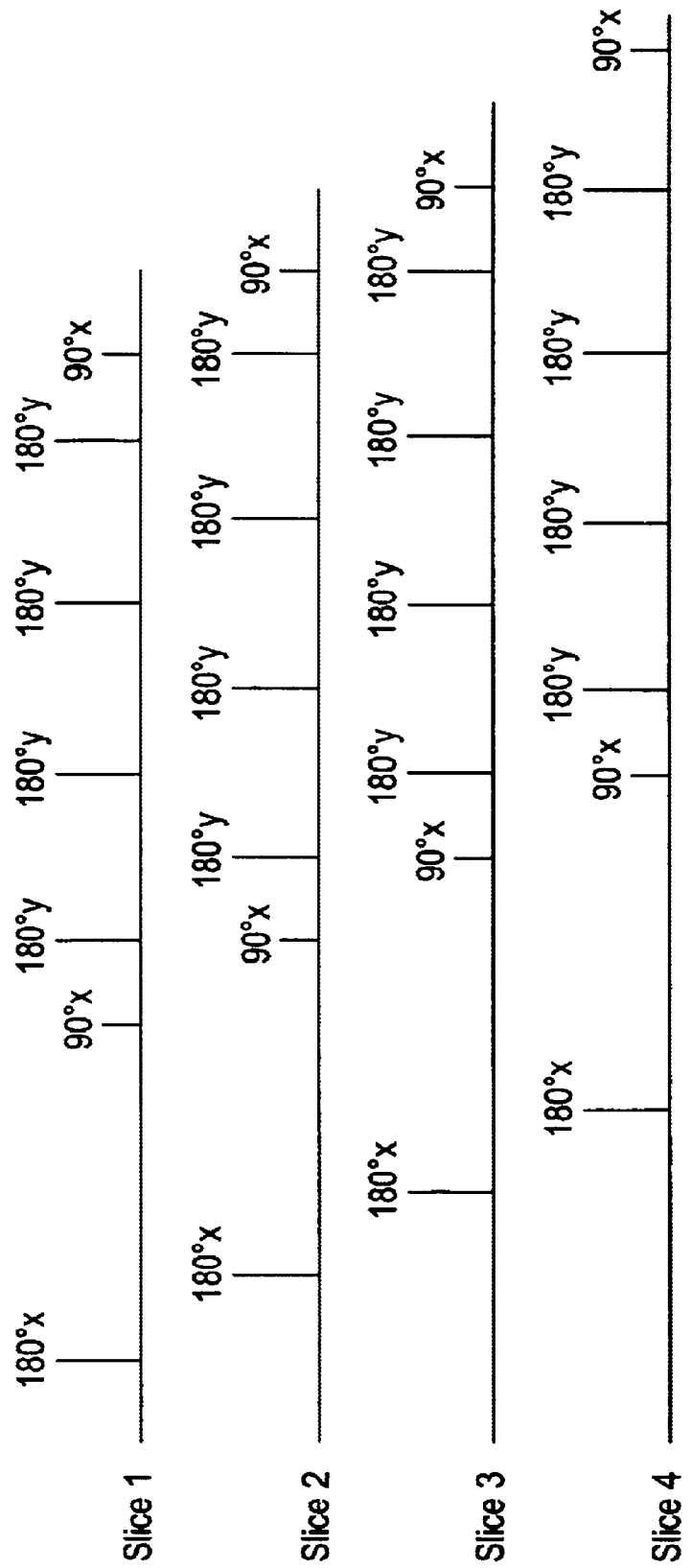
FIG. 6 shows an example of pulse sequences to be employed in multiple slice imaging.
Figure 7:
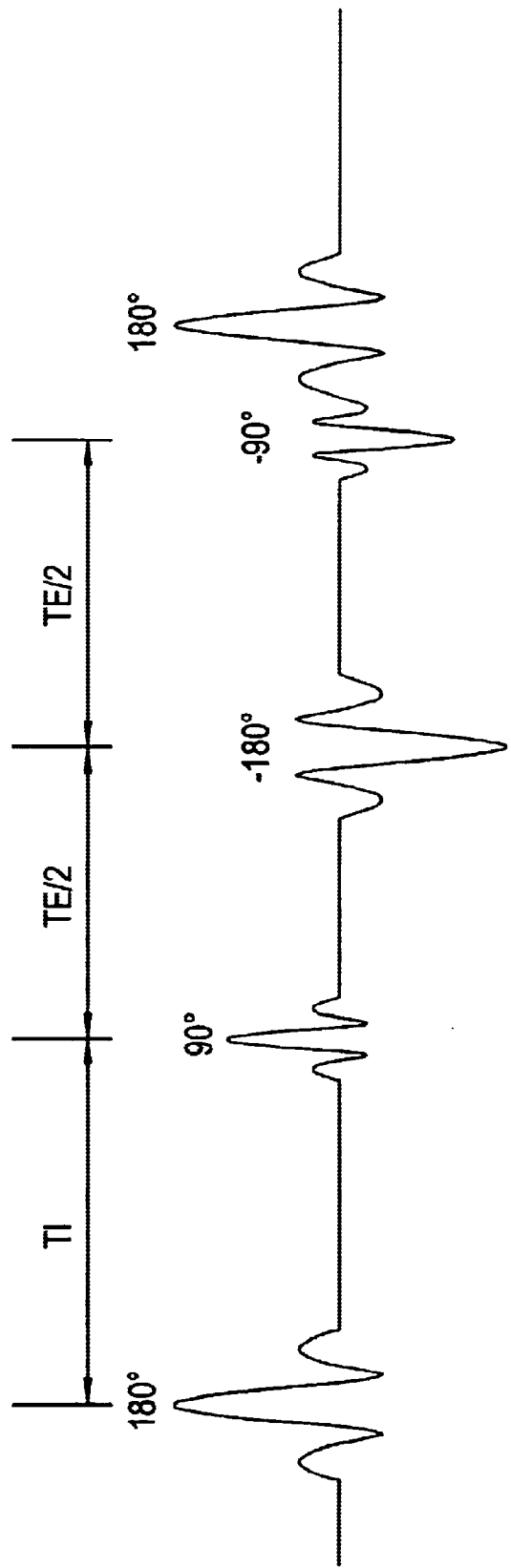
FIG. 7 shows a conventional pulse sequence of RF pulses.
Figure 8:
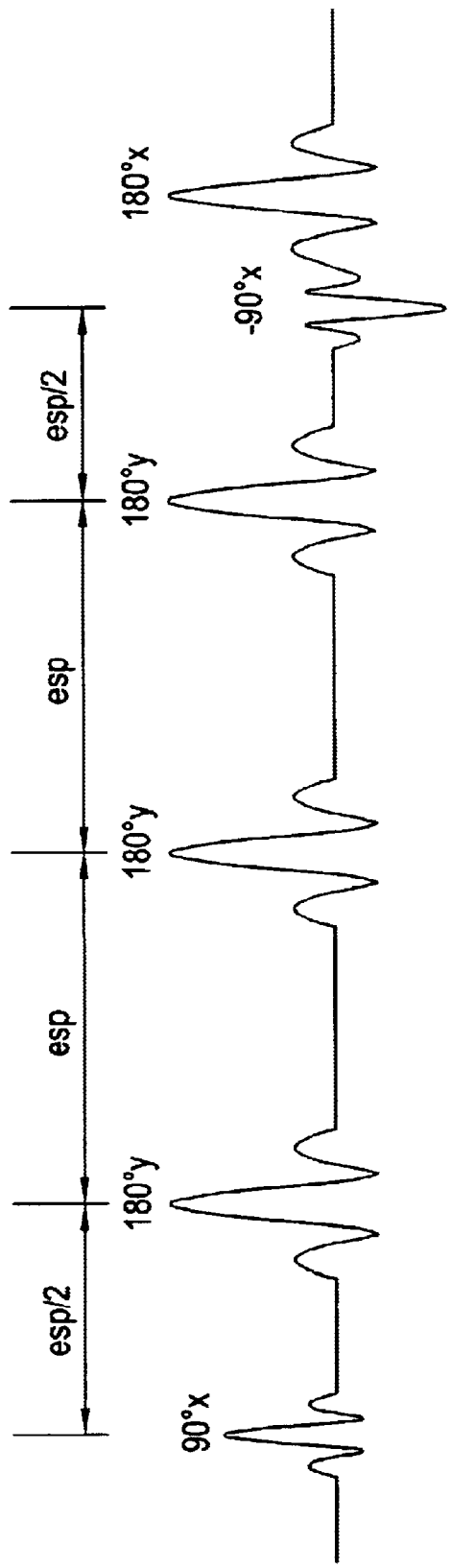
FIG. 8 shows a conventional pulse sequence of RF pulses.

Excitation initiated with application of an RF pulse is always selective excitation. Therefore, the aforesaid sequence of excitations can be, as shown in FIG. 6, started a plurality of times at successive time instants within the inversion time TI with slices changed sequentially. This enables multiple slice imaging. Incidentally, all the pulse sequences shown in FIG. 5 include the magnetic field gradients Gs, Gr, and Gp and the spin echo MR as shown in FIG. 3, though the magnetic field gradients and spin echo are not shown.

The present invention has been described based on the examples of the preferred embodiments. A person with an ordinary skill in the art to which the present invention belongs will be able to make various variations or replacements without a departure from the technological scope of the present invention. Consequently, the technological scope of the present invention contains not only the aforesaid examples of the embodiment but also all embodiments conformable to claims.

Many widely different embodiments of the invention may be configured without departing from the spirit and the scope of the present invention. It should be understood that the present invention is not limited to the specific embodiments described in the specification, except as defined in the appended claims.

What is claimed is:

1. A spin exciting method for producing an image using a magnetic resonance signal induced by spins in a subject being imaged according to the fast spin echo technique combined with the inversion recovery technique, comprising the steps of:

exciting spins with application of 180° pulse;

exciting the spins with application of a first 90° x pulse after the elapse of a first time;

exciting the spins with application of a first 180° y pulse after the elapse of a second time;

exciting the spins by application a second 180° y pulse an odd number of times after the elapse of a third time that is double the second time; and exciting the spins with application of a second 90° x pulse after the elapse of the second time, wherein the second 90° x pulse is a +90° x pulse if the first time is shorter than a polarity recovery time for spins that are used for imaging.

2. A spin exciting method according to claim 1, wherein the second 90° x pulse is a –90° x pulse.

3. A spin exciting method according to claim 2, wherein the first time is longer than the polarity recover time for spins that are used for imaging.

4. A spin exciting method according to claim 1, wherein excitation is always selective excitation.

5. A spin exciting method according to claim 1 further comprising:

applying a first readout gradient between the first 90° pulse and the first 180° y pulse; and applying a second readout gradient between the first 180° y pulse and the second 180° y pulse.

6. A in exciting spin method according to claim 5 further comprising applying a first set of phase-encoding magnetic field gradients before and after the second readout gradient.

7. A magnetic resonance imaging method for producing an image using a magnetic resonance signal induced by spins in a subject being imaged according to the fast spin echo technique combined with the inversion recovery technique, comprising the steps of:

exciting spins with application of a 180° pulse;

exciting the spins with application of a first 90° x pulse after the elapse of a first time;

exciting the spins with application of a first 180° y pulse after the elapse of a second time;

exciting the spins by applying a second 180° y pulse an odd number of times after the elapse of a third time that is double the second time;

exciting the spins with application of a second 90° x pulse after the elapse of the second time, wherein the second 90° x pulse is a +90° x pulse if the first time is shorter than a polarity recovery time for spins that are used for imaging;

reading a spin echo during the third time; and producing an image according to the spin echo.

8. A magnetic resonance imaging method according to claim 7, wherein the second 90° x pulse is a –90° x pulse.

9. A magnetic resonance imaging method according to claim 8, wherein the first time is longer than the polarity recovery time for spins that are used for imaging.

10. A magnetic resonance imaging method according to claim 7, wherein excitation is always selective excitation.

11. A magnetic resonance imaging method according to claim 10, wherein a series of excitations stating with excitation initiated with application of the 180° pulse and ending with excitation initiated with application of the second 90° x pulse is started a plurality of times at successive time instants within the first time with slices changed sequentially.

12. A magnetic resonance imaging method according to claim 7, further comprising:

applying a first readout gradient between the first 90° pulse and the first 180° y pulse; and applying a second readout gradient between the first 180° y pulse and the second 180° y pulse.

13. A magnetic resonance imaging method according to claim 12, further comprising applying a first set of phase-encoding magnetic field gradients before and after the second readout gradient.

14. A magnetic resonance imaging system according to claim 13 wherein the gradient coil assembly generates a first set of phase-encoding magnetic field gradients before and after the second readout gradient.

15. A magnetic resonance imaging system for producing an image using a magnetic resonance signal induced by spins in a subject being imaged according to the fast spin echo technique combined with the inversion recovery technique, comprising:

a spin exciting device for exciting spins with application of a 180° pulse, exciting the spins with application of a first 90° x pulse after the elapse of a first time, exciting the spins with application of a first 180° y pulse after the elapse of a second time, exciting the spins sequentially by applying a second 180° y pulse an odd number of times after the elapse of a third time that is double the second time, and exciting the spins with application of a second 90° x pulse after the elapse of the second time, wherein the second 90° x pulse is a +90° x pulse if the first time is shorter than a polarity recovery time for spins that are used for imaging;

an echo reading device for reading a spin echo during the third time; and an image producing device for producing an image according to the spin echo.

16. A magnetic resonance imaging system according to claim 15, wherein the second 90° x pulse is –90° x pulse.

17. A magnetic resonance imaging system according to claim 16, wherein the first time is longer than the polarity recovery time for spins that are used for imaging.

18. A magnetic resonance imaging system according to claim 15, wherein excitation is always selective excitation.

19. A magnetic resonance imaging system according to claim 18, further comprising a control device for starting a series of excitations, which starts with excitation initiated with application of the 180° pulse and ends with excitation initiated with application of the 90° x pulse, a plurality of times at successive time instants within the first time with slices changed sequentially.

20. A magnetic resonance imaging system according to claim 15, further comprising a gradient coil assembly for generating a first readout gradient between the first 90° pulse and the first 180° y pulse, and for generating a second readout gradient between the first 180° y pulse and the second 180° y pulse.

* * * * *